(12) United States Patent
Nishizawa

(10) Patent No.: US 12,696,752 B2
(45) Date of Patent: Jul. 28, 2026

(54) SEMICONDUCTOR DEVICE AND METHOD FOR MANUFACTURING THE SAME

(71) Applicant: Mitsubishi Electric Corporation, Tokyo (JP)

(72) Inventor: Koichiro Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 398 days.

(21) Appl. No.: 18/577,304

(22) PCT Filed: Sep. 1, 2022

(86) PCT No.: PCT/JP2022/032927
§ 371 (c)(1),
(2) Date: Jan. 8, 2024

(87) PCT Pub. No.: WO2023/079824
PCT Pub. Date: May 11, 2023

(65) Prior Publication Data
US 2024/0312915 A1     Sep. 19, 2024

(30) Foreign Application Priority Data

Nov. 4, 2021     (WO) .................. PCT/JP2021/040596

(51) Int. Cl.
*H10W 20/41*          (2026.01)
*H10W 20/00*          (2026.01)

(52) U.S. Cl.
CPC ....... *H10W 20/425* (2026.01); *H10W 20/035* (2026.01); *H10W 20/0526* (2026.01)

(58) Field of Classification Search
CPC ............. H10W 20/425; H10W 20/035; H10W 20/0526; H10W 20/01; H10W 20/043;
(Continued)

(56) References Cited

U.S. PATENT DOCUMENTS

2011/0042822 A1     2/2011   Nishizawa
2014/0035145 A1*    2/2014   Nishizawa ......... H10D 64/0116
257/751
(Continued)

FOREIGN PATENT DOCUMENTS

JP          2011-44546 A       3/2011
JP          2016-156039 A      9/2016
(Continued)

OTHER PUBLICATIONS

Ueno et al.; "Reliability tests of electroless barriers against copper diffusion under bias-temperature stress with n- and p-type substrates"; Japanese Journal of Applied Physics 55, 056501; Mar. 2016; pp. 1-7.

(Continued)

*Primary Examiner* — Tucker J Wright
(74) *Attorney, Agent, or Firm* — Studebaker Brackett PLLC

(57)          ABSTRACT

The present disclosure relates to a semiconductor device and a method for manufacturing the same, and an object thereof is to provide a semiconductor and a method for manufacturing the same, the semiconductor device not diffusing a material of a metal layer to a semiconductor substrate. A semiconductor device of the present disclosure includes a semiconductor substrate which is formed of GaAs, a first barrier layer which is formed of an alloy containing Ni on the semiconductor substrate, a second barrier layer which is formed of Co or an alloy containing Co on the first barrier layer, and a metal layer which is formed on the second barrier layer. A Ni concentration in the first barrier layer is 80 at % or lower.

7 Claims, 14 Drawing Sheets

<u>10</u>

(58) Field of Classification Search

CPC .. H10W 20/40; H10W 20/4403; C23C 18/18; C23C 18/32; H10D 64/011; H10D 64/62; H10P 14/40; H10P 14/46

See application file for complete search history.

(56) References Cited

U.S. PATENT DOCUMENTS

| | | |
|---|---|---|
| 2016/0247765 A1 | 8/2016 | Inatomi et al. |
| 2016/0351442 A1 | 12/2016 | Nishizawa |
| 2020/0274043 A1 | 8/2020 | Bernhardt |
| 2021/0193828 A1 | 6/2021 | Cheng et al. |

FOREIGN PATENT DOCUMENTS

| | | |
|---|---|---|
| JP | 2018-200952 A | 12/2018 |
| TW | 202125591 A | 7/2021 |
| WO | 2015/145815 A1 | 10/2015 |

OTHER PUBLICATIONS

Nishizawa et al.; "Ni—P Co—W—P Electroless Plating Films on GaAs as Cu Diffusion Barrier"; Interfinish 2020 Dijest; Sep. 2020; pp. 1.

International Search Report issued in PCT/JP2022/032927; mailed Nov. 15, 2022.

International Search Report issued in PCT/JP2021/040596; mailed Feb. 8, 2022.

Office Action issued in TW 111141114; publshed by the Taiwanese Patent Office on Aug. 4, 2023.

* cited by examiner

FIG.6

SEMICONDUCTOR DEVICE AND METHOD FOR MANUFACTURING THE SAME

FIELD

The present disclosure relates to a semiconductor device and a method for manufacturing the same.

BACKGROUND

PTL 1 discloses a technique in which a barrier layer is provided between a semiconductor substrate and a metal layer. The barrier layer is provided for preventing a material of the metal layer from being diffused to the semiconductor substrate. Further, as a barrier layer with high performance of preventing diffusion, a Co-alloy-based film has been disclosed.

CITATION LIST

Patent Literature

[PTL 1] WO 2015/145815 A1

SUMMARY OF THE INVENTION

Problems to be Solved by the Invention

However, when a Co alloy film is retained for a long time under an environment at a high temperature such as 200° C. or higher, because a part of Co is diffused to a semiconductor substrate side, pores are formed in the Co alloy film. As a result, there is a problem that the Co alloy film is degraded and performance of preventing diffusion of a metal layer to the semiconductor substrate is lowered.

The present disclosure has been made for solving the above-described problems, and a first object is to provide a semiconductor device which does not diffuse a material of a metal layer to a semiconductor substrate. Further, a second object is to provide a method for manufacturing a semiconductor device which does not diffuse a material of a metal layer to a semiconductor substrate.

Solution to Problem

The first aspect of the present disclosure is preferably a semiconductor device comprising of a semiconductor substrate which is formed of GaAs, a first barrier layer which is formed of an alloy containing Ni on the semiconductor substrate, a second barrier layer which is formed of Co or an alloy containing Co on the first barrier layer, and a metal layer which is formed on the second barrier layer, wherein a Ni concentration in the first barrier layer is 80 at % or lower.

Further, the second aspect of the present disclosure is preferably a method of manufacturing a semiconductor device, the method comprising a step of forming a deposition layer, in which metal exhibiting catalytic activity is deposited, on a semiconductor substrate formed of GaAs, a step of forming a first barrier layer, which is formed of an alloy containing Ni, on the deposition layer by a plating method, a step of forming a second barrier layer, which is formed of Co or an alloy containing Co, on the first barrier layer by the plating method, a step of forming a metal layer on the second barrier layer; and a step of conducting a heat treatment until a Ni concentration in the first barrier layer becomes 80 at % or lower.

Advantageous Effects of Invention

According to the first and second aspect of the present disclosure, a semiconductor device can be provided which does not diffuse the material of the metal layer to the semiconductor substrate.

BRIEF DESCRIPTION OF DRAWINGS

FIG. 6 is a cross-sectional view at times before and after a Ni alloy film and a Co alloy film, which are laminated on a Si substrate, are maintained in a use environment.

DESCRIPTION OF EMBODIMENTS

First Embodiment

Figure 1:
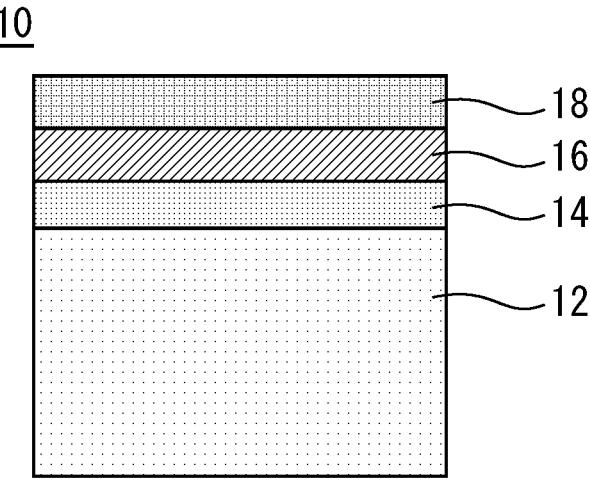
FIG. 1 is a cross-sectional view of a semiconductor device 10 according to a first embodiment of the present disclosure.

FIG. 1 is a cross-sectional view of a semiconductor device 10 according to a first embodiment of the present disclosure. The semiconductor device 10 includes a semiconductor substrate 12 formed of GaAs. A Ni barrier layer 14 is formed on the semiconductor substrate 12. The Ni barrier layer 14 is formed of Ni or an alloy containing Ni. An alloy containing Ni is Ni—P, for example. Here, Ni—P denotes an alloy of Ni and P, and an alloy will hereinafter be expressed by using a hyphen in the same manner. A Co barrier layer 16 is formed on the Ni barrier layer 14. The Co barrier layer 16 is formed of Co or an alloy containing Co. A metal layer 18 formed of Cu is formed on the Co barrier layer 16.

Figure 2:
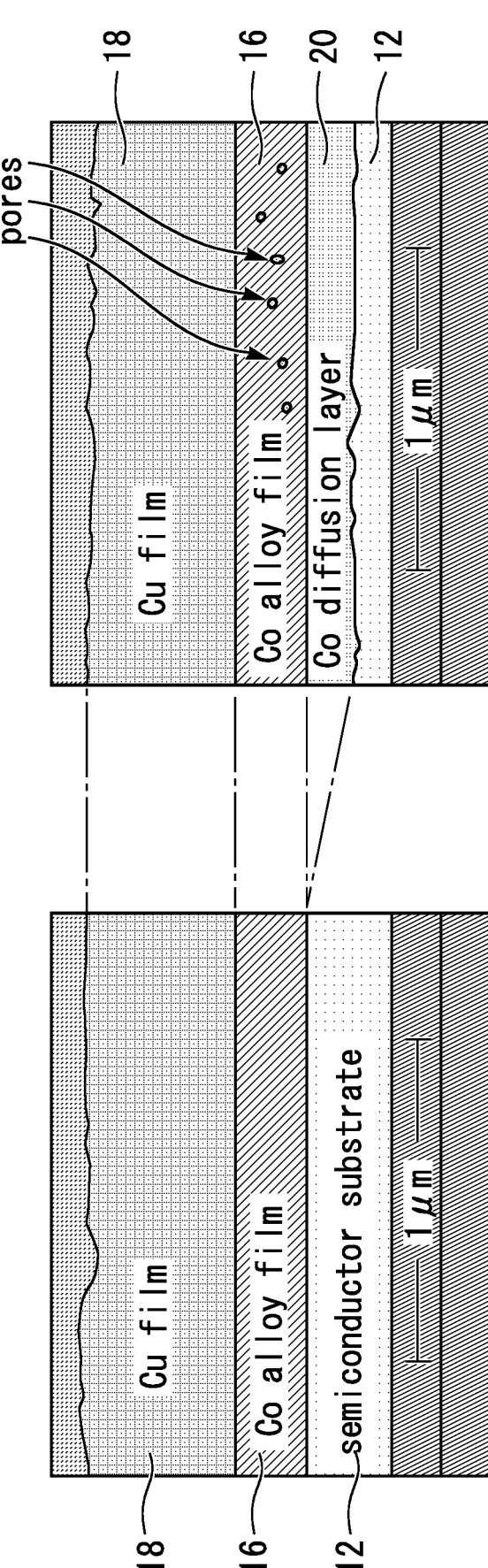
FIG. 2 is a cross-sectional view of a sample including a Co alloy film at times before and after a long-time heat treatment.

FIG. 2 is a cross-sectional view of a sample including a Co alloy film at times before and after a long-time heat treatment. A left diagram in FIG. 2 is a cross-sectional view of the sample in which the Co barrier layer 16 formed of an alloy containing Co is provided between the semiconductor substrate 12 formed of GaAs and the metal layer 18 formed of Cu. A right diagram in FIG. 2 is a cross-sectional view of this sample which results from a heat treatment at 270° C. for 1,000 hours. It can be understood from the right diagram in FIG. 2 that when the heat treatment is performed, the semiconductor substrate 12 reacts with the Co barrier layer 16, and a Co diffusion layer 20 is formed between the two layers. Further, in this case, pores are formed in the Co barrier layer 16. In other words, Co in the Co barrier layer 16 is diffused to the semiconductor substrate 12 side. At the same time, the Co barrier layer becomes porous because Co is decreased by the amount diffused, whereby diffusion paths of Cu are increased. As a result, diffusion barrier characteristics of the Co barrier layer 16 are lowered.

Figure 3:
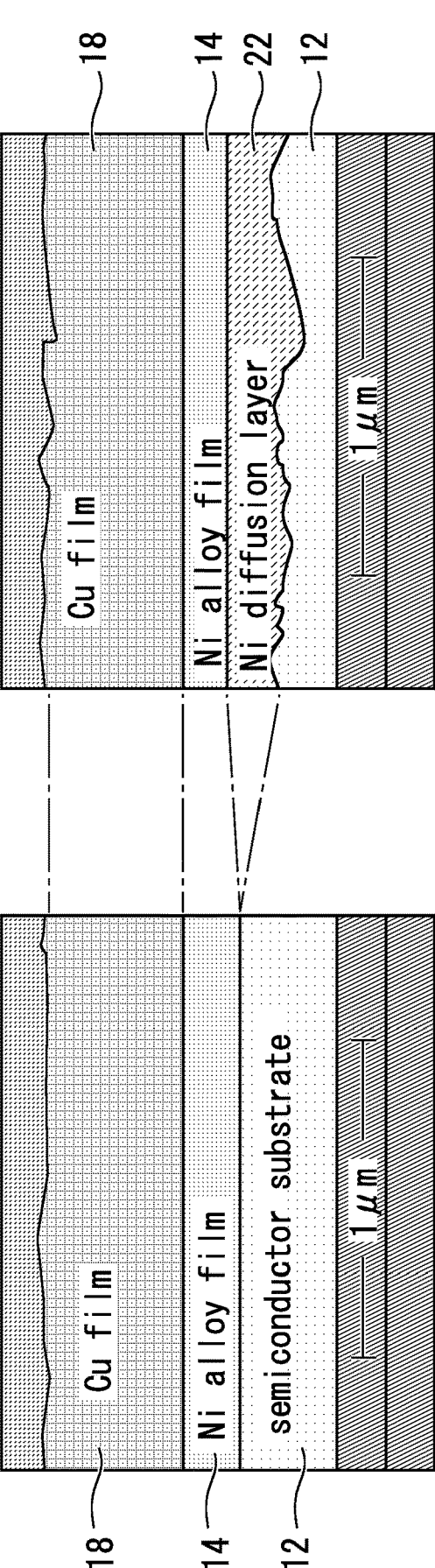
FIG. 3 is a cross-sectional view of a sample including a Ni alloy film at times before and after a long-time heat treatment.

FIG. 3 is a cross-sectional view of a sample including a Ni alloy film at times before and after a long-time heat treatment. A left diagram in FIG. 3 is a cross-sectional view of the sample in which the Ni barrier layer 14 formed of an alloy containing Ni is provided between the semiconductor substrate 12 formed of GaAs and the metal layer 18 formed of Cu. A right diagram in FIG. 3 is a cross-sectional view of this sample which results from a heat treatment at 270° C. for 1,000 hours. It can be understood from the right diagram in FIG. 3 that when the heat treatment is performed, the semiconductor substrate 12 reacts with the Ni barrier layer 14, and a Ni diffusion layer 22 is formed between the two layers. However, differently from the Co barrier layer 16 in the right diagram in FIG. 2, pores are not formed in the Ni barrier layer 14. In other words, in a case where Ni in the Ni barrier layer 14 is diffused to the semiconductor substrate 12 side, intrusion by pores into the Ni barrier layer does not occur, and the diffusion paths of Cu are not increased. As a result, diffusion barrier characteristics of the Ni barrier layer 14 are not lowered.

Figure 4:
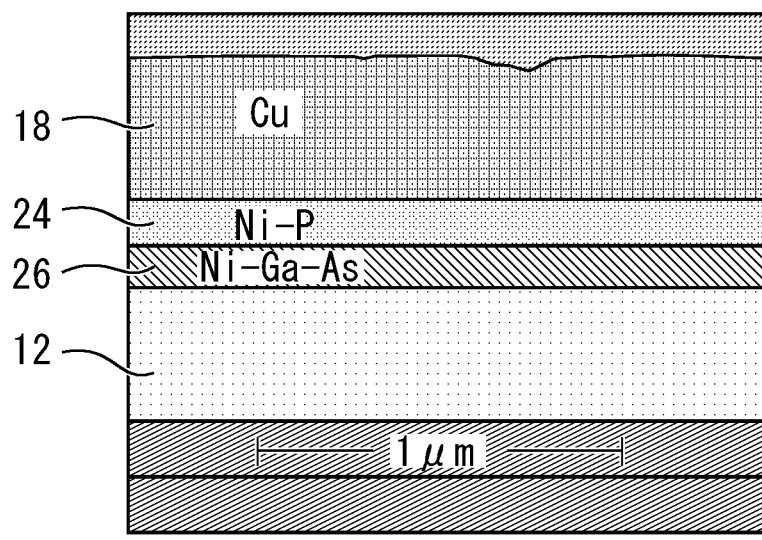
FIG. 4 is a cross-sectional view of a sample including a Ni alloy film at a time after a heat treatment.

FIG. 4 is a cross-sectional view of a sample including a Ni alloy film at a time after a heat treatment. Here, a state after a heat treatment at 270° C. for 3 hours is performed for the sample in which a barrier layer 24 formed of Ni—P is provided between the semiconductor substrate 12 formed of GaAs and the metal layer 18 formed of Cu is illustrated. In this case, it can be understood that a Ni—Ga—As film 26 is produced in an interface between the barrier layer 24 and the semiconductor substrate 12.

Figure 5:
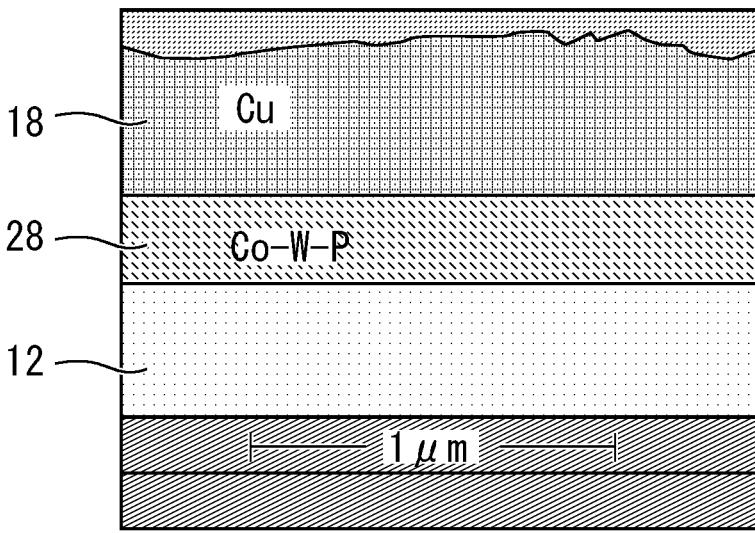
FIG. 5 is a cross-sectional view of a sample including a Co alloy film at a time after a heat treatment.

FIG. 5 is a cross-sectional view of a sample including a Co alloy film at a time after a heat treatment. Here, a state after a heat treatment at 270° C. for 3 hours is performed for the sample in which a barrier layer 28 formed of Co—W—P is provided between the semiconductor substrate 12 formed of GaAs and the metal layer 18 formed of Cu is illustrated. In this case, it can be understood that an obvious reaction layer is not produced in an interface between the barrier layer 28 and the semiconductor substrate 12. From a comparison between FIG. 4 and FIG. 5, Ni has higher reactivity with the semiconductor substrate than Co, that is, has higher adhesion.

In the semiconductor device 10, the Ni barrier layer 14 is formed on the semiconductor substrate 12, and the Co barrier layer 16 is formed further on that. In a case where a heat treatment is performed for the semiconductor device 10, the Ni barrier layer 14 contacting with the semiconductor substrate 12 does not form pores. Further, the Co barrier layer 16 does not contact with the semiconductor substrate 12 and thus does not form pores. Because the Co barrier layer is not degraded and the Ni barrier layer itself has a Cu diffusion barrier effect, it becomes possible to provide a semiconductor device which does not diffuse a material of a metal layer to a semiconductor substrate. Further, because the interface to the semiconductor substrate 12 is the Ni barrier layer 14, an effect of improving adhesion of an electrode can be expected.

Figure 6:
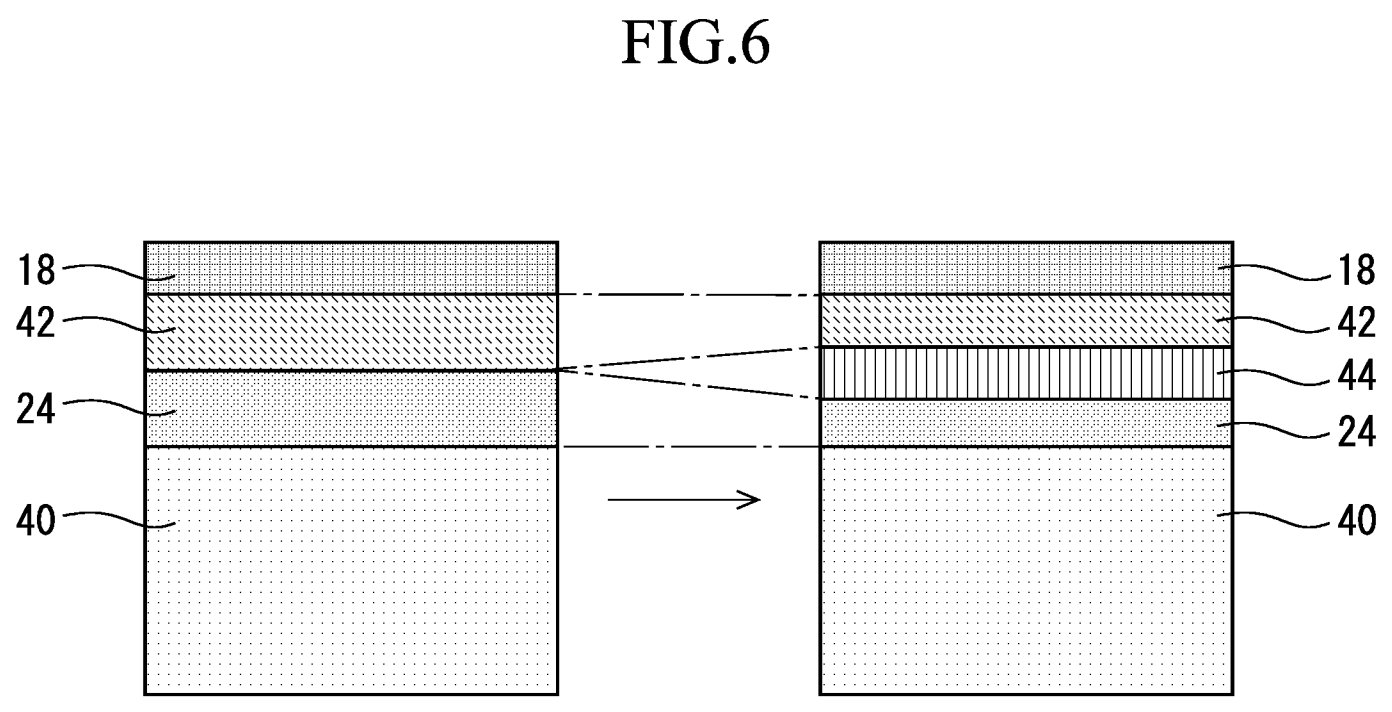

FIG. 6 is a cross-sectional view at times before and after a Ni alloy film and a Co alloy film, which are laminated on a Si substrate, are maintained in a use environment. In a left diagram in FIG. 6, the barrier layer 24 formed of Ni—P is formed on a semiconductor substrate 40 formed of Si. A Co alloy layer 42 formed of Co—P is formed on the barrier layer 24. The metal layer 18 formed of Cu is formed on the Co alloy layer 42. Note that the barrier layer 24 and the Co alloy layer 42 are formed by electroless plating, for example.

A right diagram in FIG. 6 illustrates a state at a time after the sample in the left diagram in FIG. 6 is maintained in the use environment. In this case, the barrier layer 24 and the Co alloy layer 42 are mutually diffused in an interface and form a diffusion layer 44 formed of Ni—Co—P. That is, because the Co alloy layer 42 having a high diffusion barrier effect is decreased, barrier characteristics against Cu are lowered.

Note that the use environment mentioned herein is an environment at approximately 100° C. to 200° C., for example. A semiconductor chip having a transistor element performs signal amplification and causes a current proportional to a signal to flow in a micro region. As a result, its temperature rises to approximately 100° C. to 200° C. in an operation. In addition, such a semiconductor chip is in general requested to have a life of approximately 10E5 to 10E7 hours. Thus, the barrier layer 24 and so forth which configure the semiconductor chip are desired to have characteristics with which they are less likely to be degraded in this environment.

Figure 7:
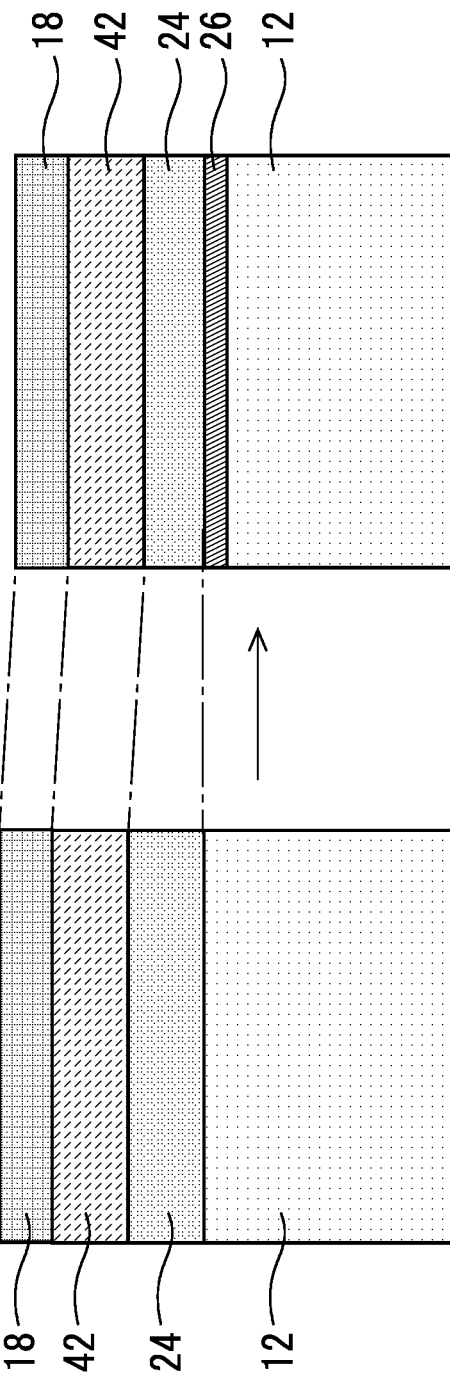
FIG. 7 is a cross-sectional view of a Ni alloy film and a Co alloy film, which are laminated on a GaAs substrate, at times before and after a heat treatment.

FIG. 7 is a cross-sectional view of a Ni alloy film and a Co alloy film, which are laminated on a GaAs substrate, at times before and after a heat treatment. In a left diagram in FIG. 7, the barrier layer 24 formed of Ni—P is formed on the semiconductor substrate 12 formed of GaAs. The Co alloy layer 42 formed of Co—P is formed on the barrier layer 24. The metal layer 18 formed of Cu is formed on the Co alloy layer 42. Note that the barrier layer 24 and the Co alloy layer 42 are formed by electroless plating, for example.

A right diagram in FIG. 7 illustrates a state at a time after the heat treatment is performed for a sample in the left diagram in FIG. 7. In this case, Ni of the barrier layer 24 is diffused to the semiconductor substrate 12 side, and the Ni—Ga—As film 26 is formed.

Because Ni is decreased due to formation of the Ni—Ga—As film 26, a P concentration in the barrier layer 24 rises. Although the barrier layer 24 formed by plating is a non-crystalline layer, in a case where a Ni concentration is 80 at % or lower, accompanying this composition change, the barrier layer 24 is changed into a crystalline film. More specifically, $Ni_{12}P_5$, $Ni_7P_3$, $Ni_3P$, and so forth are crystallized, and a more stable state is established. As a result, mutual diffusion between the barrier layer 24 and the Co alloy layer 42 is inhibited. That is, because the Co alloy layer 42 having the high diffusion barrier effect is not decreased, the barrier characteristics against Cu are maintained.

Film formation of the barrier layer 24 is performed at a P concentration of 2 at % to 16 at %, for example. In this case, the P concentration in the barrier layer 24 resulting from the heat treatment increases to 20 at % to 40 at %.

Note that this heat treatment is an aging treatment, for example. In a process for manufacturing a semiconductor chip, in order to stabilize transistor characteristics or adhesion of formed electrodes and so forth, an aging treatment for approximately several minutes to several hours might be performed at 100° C. or higher. In a case where the semiconductor substrate is formed of GaAs, the barrier characteristics against Cu can be maintained also by a treatment in a relatively short period such as the aging treatment.

As described above, in a case where the semiconductor substrate is formed of GaAs, the Ni alloy film and the Co alloy film are laminated on that, and the barrier characteristics against Cu can thereby be maintained. That is, by a configuration of the semiconductor device 10, a semiconductor device can be provided which does not diffuse the material of the metal layer to the semiconductor substrate.

In the following, a method of manufacturing the semiconductor device 10 will be described by raising, as an example, a case where a Cu electrode is used as a back-surface electrode serving as a ground of a GaAs semiconductor device. This device is used for a microwave monolithic IC or the like, for example.

Figure 8:
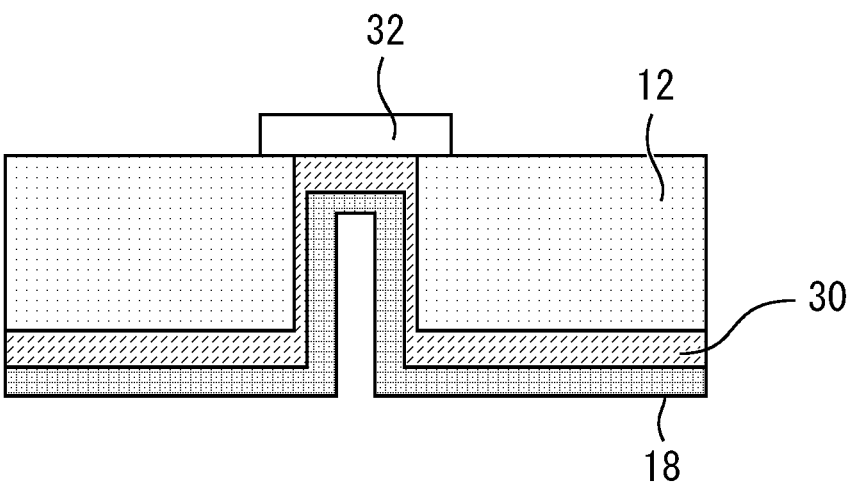
FIG. 8 is a cross-sectional view of a case where a Cu diffusion barrier film is formed on the via structure by a PVD method.

Before the description about the method for manufacturing, a description will be made about existing problems in a case where a film is formed on a via structure, as a case for comparison. FIG. 8 is a cross-sectional view of a case where a Cu diffusion barrier film is formed on the via structure by a PVD method. The via structure is a through-electrode structure for electrically connecting a front surface and a back surface of the semiconductor substrate together. As a method for performing film formation of a diffusion barrier film on the via structure, the PVD method has been known. In view of properties of a mechanism, in the PVD method, film formation amounts for a flat surface portion and a perpendicular portion which is perpendicular to a flat surface portion are different. Specifically, the film formation amount for the perpendicular portion is approximately 1/10 thinner than the film formation amount for the flat surface portion. In other words, as for a barrier layer 30 for which film formation is performed on the via structure by the PVD method, a part of the film becomes thin, and a risk that Cu is diffused from that part to the semiconductor substrate is thereby increased.

Figure 9:
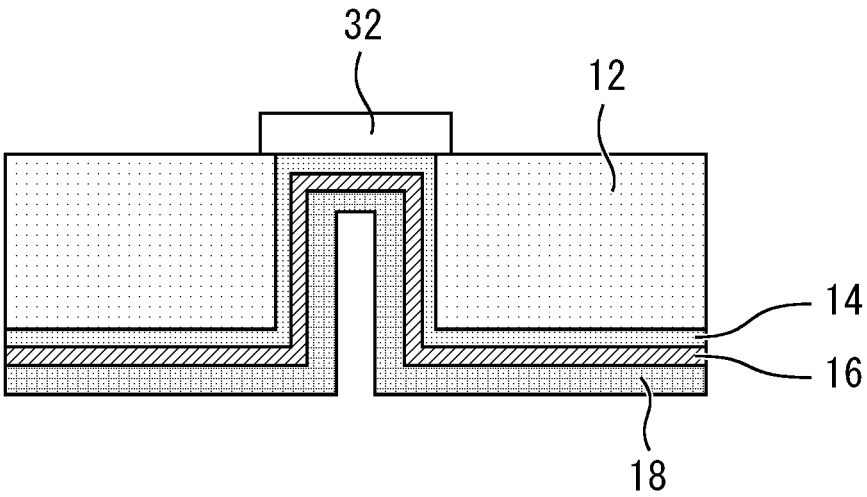
FIG. 9 is a cross-sectional view of a case where a Cu diffusion barrier layer is formed on the via structure by a plating method.

Accordingly, a technique is present in which in order to secure sufficient coverage for the via structure, the diffusion barrier film is formed by an electroless plating method instead of the PVD method. FIG. 9 is a cross-sectional view of a case where a Cu diffusion barrier layer is formed on the via structure by a plating method. Film formation of the Ni barrier layer 14 and the Co barrier layer 16 is performed by the electroless plating method, layers with a uniform thickness can thereby be formed throughout the flat surface portion and the perpendicular portion, and a risk of Cu diffusion is thus lowered. Accordingly, in the present embodiment, a description will be made about a method of manufacturing by using this plating method.

Figure 10:
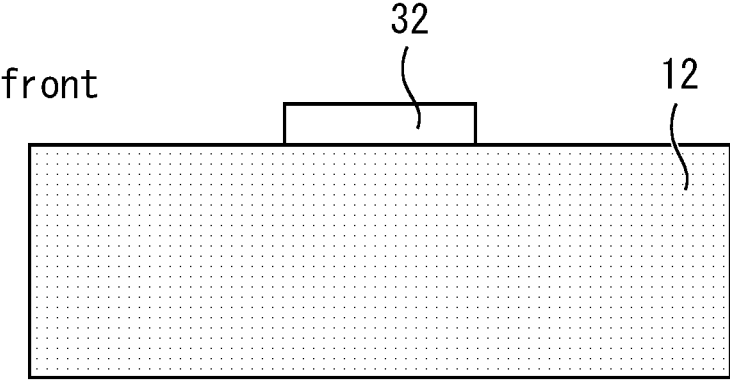
FIG. 10 is a cross-sectional view illustrating a creation step of a front-surface-side element for fabricating a structure illustrated in FIG. 9.

First, an electric circuit is formed while one side of the semiconductor substrate 12 of a single crystal of GaAs is set as a front surface. FIG. 10 is a cross-sectional view illustrating a creation step of a front-surface-side element for fabricating a structure illustrated in FIG. 9. Although not illustrated, as wafer processing for forming the electric circuit, epitaxial growth, metal film formation, insulation film formation, transfer patterning, and so forth are repeated. When the circuit of the front surface is formed, a counter electrode 32 of a through-electrode portion is formed. Note that the wafer processing is performed in a state where the semiconductor substrate 12 of the single crystal of GaAs has a disk shape with a diameter of 4 to 8 inches and has a thickness of 0.5 to 0.6 millimeters.

Figure 11:
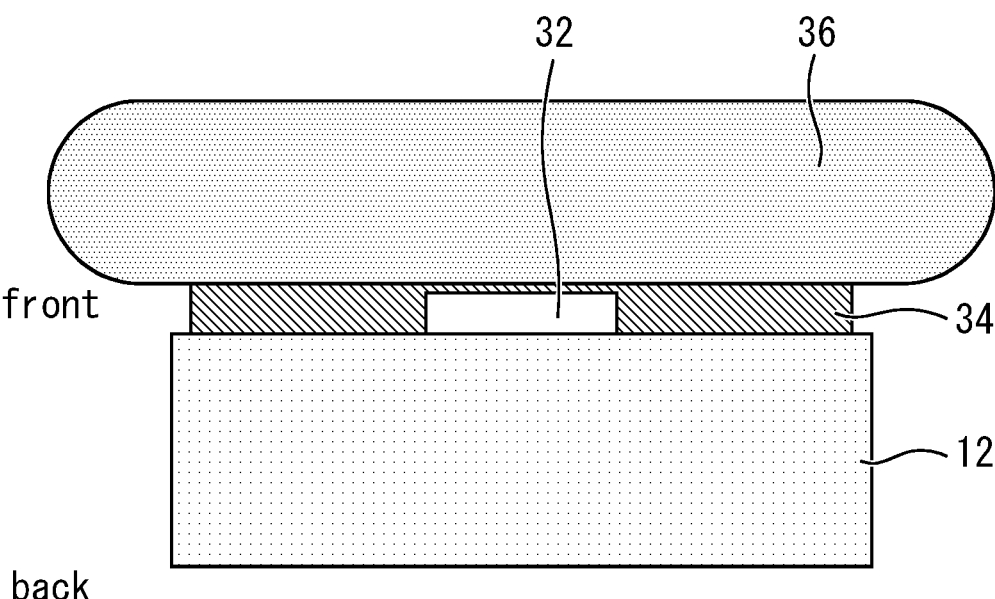
FIG. 11 is a cross-sectional view illustrating a support substrate pasting step for fabricating the structure illustrated in FIG. 9.

Next, a support substrate is pasted. FIG. 11 is a cross-sectional view illustrating a support substrate pasting step for fabricating the structure illustrated in FIG. 9. Here, after the wafer processing of the front surface of the substrate is completed, the front surface side of the substrate is pasted onto a support substrate 36 by a wax material 34. Note that a tape material may be used instead of the wax material 34. Further, a thickness of the wax material 34 is set to 20 micrometers, for example.

Figure 12:
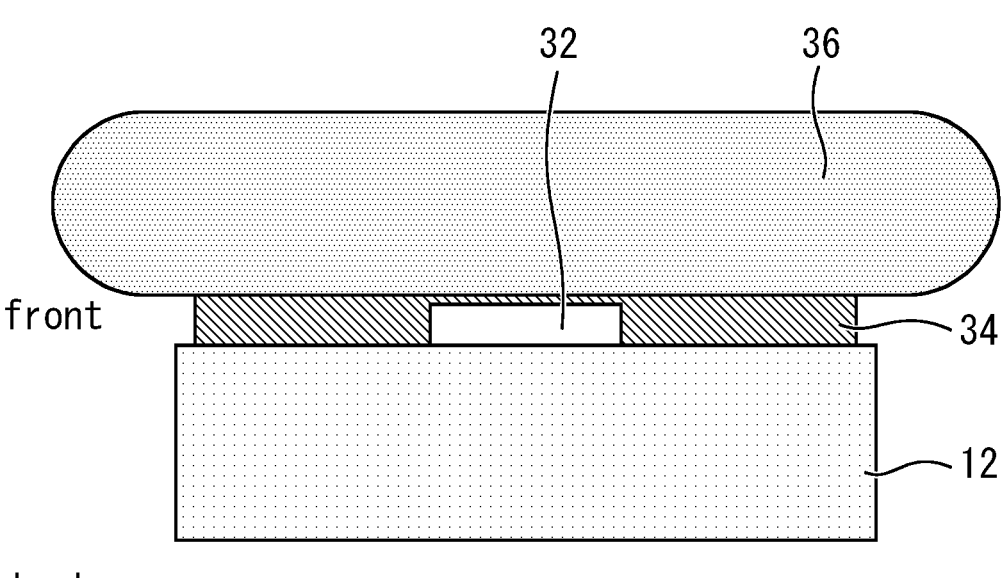
FIG. 12 is a cross-sectional view illustrating a substrate thinning step for fabricating the structure illustrated in FIG. 9.

Next, the substrate is thinned. FIG. 12 is a cross-sectional view illustrating a substrate thinning step for fabricating the structure illustrated in FIG. 9. Here, grinding and polishing are performed in a state where the semiconductor substrate 12 is pasted onto the support substrate 36, and the thickness of the semiconductor substrate 12 is thinned. The thickness of the thinned semiconductor substrate 12 is set to 100 micrometers, for example. In such a manner, the semiconductor substrate 12 is thinned, and heat dissipation and high-frequency characteristics of the device are thereby improved.

Figure 13:
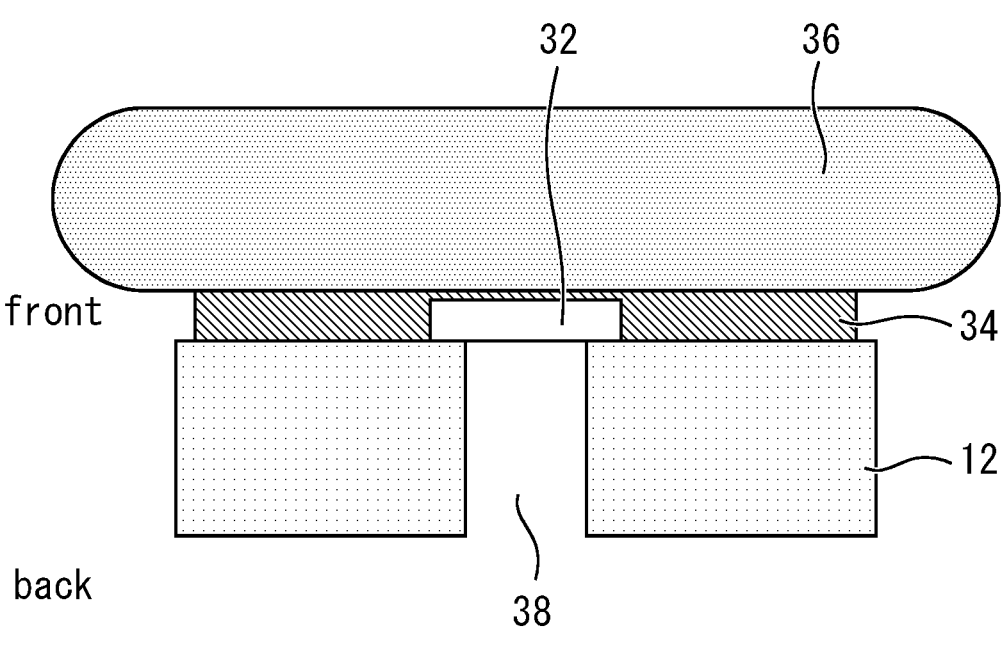
FIG. 13 is a cross-sectional view illustrating a via processing step for fabricating the structure illustrated in FIG. 9.

Next, via processing is performed. FIG. 13 is a cross-sectional view illustrating a via processing step for fabricating the structure illustrated in FIG. 9. Here, in order to form an electrode passing through the semiconductor substrate 12, a resist material is first applied to a wafer by a spin coater. Next, only a processed portion of the resist is removed by transfer-development patterning. Next, a via 38 is formed by substrate etching processing by ICP dry etching. Instead of dry etching, wet etching may be used which uses a mixed liquid or the like of sulfuric acid and a hydrogen peroxide solution. Next, the resist is removed by immersing the resist in a stripping solution, and the semiconductor substrate 12 whose back surface is exposed is thereby obtained. Note that a smaller via is more advantageous because flexibility of layout is higher, but in a too small via, etching does not progress and cannot pass through the substrate. Thus, the via is formed to have a circular column shape and a diameter of 50 micrometers, for example.

Figures 14, 15:
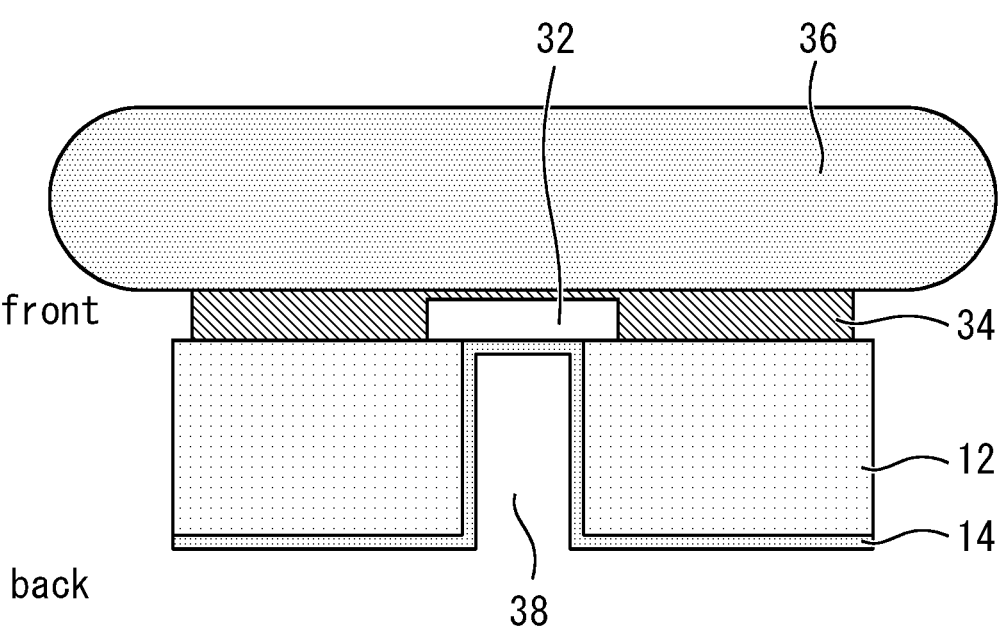
FIG. 14 is a cross-sectional view illustrating a formation step of the Ni alloy film for fabricating the structure illustrated in FIG. 9.
FIG. 15 is a cross-sectional view illustrating a formation step of the Co alloy film for fabricating the structure illustrated in FIG. 9.

Next, the Ni alloy film is formed by the electroless plating method. FIG. 14 is a cross-sectional view illustrating a formation step of the Ni alloy film for fabricating the structure illustrated in FIG. 9. First, as preliminary treatments, a hydrophilic treatment and an activator treatment are performed. For example, an oxygen plasma treatment or an ozone treatment is conducted for the wafer, and the semiconductor substrate 12 and a surface in the via of the counter electrode 32 are reformed such that they become hydrophilic. Next, when the wafer is immersed in an active liquid for an electroless plating reaction, the active liquid containing Pd ions, a surface of the semiconductor substrate 12 is dissolved by an effect of galvanic corrosion, and Pd is deposited.

For example, a Pd ion concentration is set to 10 to 100 ppm, a liquid temperature is set to 0° C. to 50° C., and an immersion time is set to 1 to 5 minutes. When a Pd deposition amount is too small, a Ni plating film for which film formation is next performed is not formed, but when the Pd deposition amount is too large, adhesion between films is deteriorated. However, because easiness of Pd deposition is different depending on a kind of a semiconductor, adjustment has to be performed approximately in the above range in accordance with a kind of the substrate.

After the preliminary treatments are completed, the wafer is immersed in an electroless Ni plating liquid having hypophosphorous acid as a main component. For example, a treatment is performed at a liquid temperature of 70° C. to 90° C. Because a plating reaction can be stabilized by performing circulation, filtration, and shaking of the liquid together, film formation of a smooth plating film can be performed. As a result, because Ni ions are deposited as Ni by a catalytic action of Pd and eutectic deposition of P as a liquid component occurs at the same time, a Ni—P alloy film is formed. Here, Pd is raised as an example of a catalytic metal, but by using metal exhibiting catalytic activity for electroless plating deposition such as Au, Ag, Pt, Ni, Sn, or Ru, the Ni alloy film can similarly be obtained.

Note that here, the Ni alloy film is formed by the plating method but may be formed by other means such as the PVD method or an evaporation method. In such a case, a step of depositing metal exhibiting catalytic activity such as Pd, as the preliminary treatment, is not necessary.

Next, the Co alloy film is formed by the electroless plating method. FIG. 15 is a cross-sectional view illustrating a formation step of the Co alloy film for fabricating the structure illustrated in FIG. 9. Here, the wafer is taken out from the electroless Ni plating liquid, is washed by water, and is thereafter immersed in an electroless Co plating liquid in a state where the wafer is kept wet. Accordingly, the Co barrier layer 16 is formed following the Ni barrier layer 14. For example, a treatment is performed at a liquid temperature of 70° C. to 90° C. by using the electroless Co plating liquid having hypophosphorous acid as a main component. Because the plating reaction can be stabilized by performing circulation, filtration, and shaking of the liquid together, film formation of a smooth plating film can be performed.

Note that in a case where the Ni barrier layer 14 is formed and a surface is thereafter dried through spin-drying processing, because surface hydrophilicity is lost, the hydrophilic treatment is conducted before immersion in the plating liquid. Further, in a case where a Co deposition reaction does not easily start, the activator treatment is added as a step prior to electroless Co plating, and the Co deposition reaction can thereby be stabilized.

Figure 16:
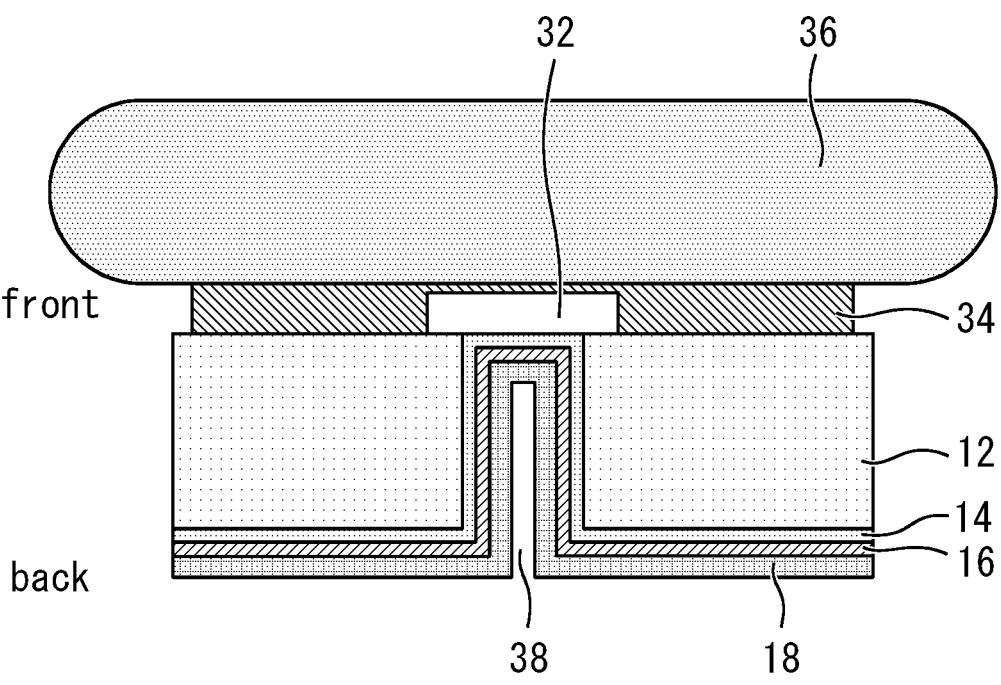
FIG. 16 is a cross-sectional view illustrating a formation step of a Cu film for fabricating the structure illustrated in FIG. 9.

Next, Cu plating is performed by an electroplating method. FIG. 16 is a cross-sectional view illustrating a formation step of a Cu film for fabricating the structure illustrated in FIG. 9. The wafer and a Cu plate are immersed in a sulfate Cu plating liquid, energization is performed while an outer periphery of the wafer is set as a cathode and the Cu plate is set as an anode, and the metal layer 18 proportional to a supplied electricity amount can thereby be formed. The liquid temperature is set to 30° C., for example. Further, the film is selectively grown in the via 38 by adjusting additive agents, and the via 38 whose internal portion is filled with Cu can thereby be manufactured. Accordingly, heat dissipation and electric characteristics of the semiconductor device can be improved.

Note that when Cu plating is formed, the electroless plating method may be used instead of the electroplating method. Also in a case of the electroless plating method, the via 38 filled with Cu can be manufactured by adjustment of the additive agents. Further, in order to prevent surface oxidation of the Cu plating, the electroless plating method may be performed as an after-treatment, or Ni plating, Pd plating, and Au plating may sequentially be performed by the electroplating method. Accordingly, adhesion of die bonding and wire bonding can be improved.

A film thickness of the Ni barrier layer 14 may be set to 0.5 micrometers, a film thickness of the Co barrier layer 16 may be set to 0.5 micrometers, and a film thickness of the metal layer 18 may be set to 3 micrometers, for example. Because reactions of electroless Ni plating and the electroless Co plating do not uniformly start in surfaces and formation failure occurs to films in a case where the film thicknesses are thin, film formation is performed to provide a film thickness of at least 0.2 micrometers. Further, because interfaces of the Ni barrier layer 14 and the Co barrier layer 16 are stripped due to residual stresses when their total film thicknesses exceed 2 micrometers, film formation is performed such that the total film thicknesses become thinner than 2 micrometers. The film thickness of the metal layer 18 has to be designed to conform to a maximum current which flows in the via.

Finally, the support substrate 36 is removed. First, the support substrate 36 and the semiconductor device are heated at 100° C. and for 1 minute or longer by a hot plate, and the wax material 34 is melted. Then, the support substrate 36 and the semiconductor device are mutually slid in parallel with a substrate surface, and the support substrate 36 is removed. Subsequently, the wafer is immersed in acetone heated to 50° C. for 10 minutes, and the wax material 34 on the surface is thereby removed. In this case, as a temperature and an immersion time become longer, removability becomes higher.

The semiconductor substrate 12 of the present embodiment is formed of GaAs, but because interactions due to thermal histories or the like after formation of metal films are similar among single-crystal semiconductor substrates, the semiconductor substrate 12 may be formed of another semiconductor material. Other materials are compound semiconductors such as InP, GaN, SiC, and SiGe and Si, for example. This can be applied to semiconductor devices and methods of manufacturing the semiconductor devices according to the following embodiments. Further, the present disclosure does not limit its uses to a back-surface electrode of an IC device or the like but is effective for all techniques in which metal film formation is performed on a semiconductor substrate. As for the semiconductor devices and the methods of manufacturing the semiconductor devices according to the following embodiments, a description will mainly be made about different points from the first embodiment.

Second Embodiment

Figure 17:
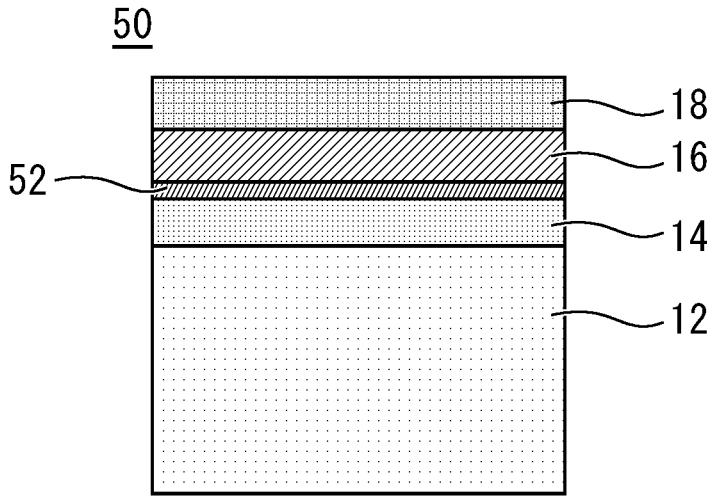
FIG. 17 is a cross-sectional view of a semiconductor device according to a second embodiment of the present disclosure.

FIG. 17 is a cross-sectional view of a semiconductor device according to a second embodiment of the present disclosure. A semiconductor device 50 is different from the first embodiment in the point that a diffusion prevention layer 52 including Pd is formed between the Ni barrier layer 14 and the Co barrier layer 16. There may be a case where when a Co alloy and a Ni alloy are continuously grown, Ni and Co are mutually diffused depending on the use environment, and barrier characteristics are lowered. Thus, the diffusion prevention layer 52 is formed between the barrier layers, and mutual diffusion is thereby prevented.

The diffusion prevention layer 52 including Pd is formed by the electroless plating method, for example. The wafer is taken out from the electroless Ni plating liquid, is washed by water, and is thereafter immersed in an electroless Pd plating liquid in a state where the wafer is kept wet, and a Pd plating film is thereby formed.

A film thickness of the diffusion prevention layer 52 is set to 0.01 micrometer, for example. In a case where the film thickness is thicker than 0.1 micrometers, because the diffusion prevention layer 52 is stripped at a boundary to the Ni barrier layer 14, the film thickness is designed to be 0.1 micrometer or thinner. Further, because deposition is not stable at thinner than 0.01 micrometer, the film thickness is designed to be 0.01 micrometer or thicker.

The diffusion prevention layer 52 is formed of Pd, but another material may be used as long as mutual diffusion can be prevented. For example, metal may be used which exhibits catalytic activity for electroless plating deposition, such as Au, Ag, Pt, Sn, or Ru.

Third Embodiment

Figure 18:
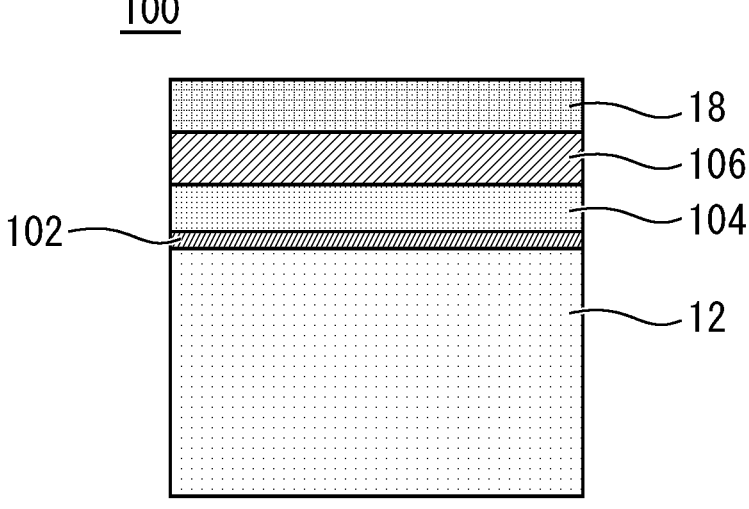
FIG. 18 is a cross-sectional view of a semiconductor device according to a third embodiment of the present disclosure.

FIG. 18 is a cross-sectional view of a semiconductor device according to a third embodiment of the present disclosure. A semiconductor device 100 is different from the first embodiment in the point that a deposition layer 102 is formed by depositing Pd on the semiconductor substrate 12 and in the point that the Ni alloy film and the Co alloy film are formed by the electroless plating method. That is, in the semiconductor device 100, a Ni-plating barrier layer 104 is formed on the deposition layer 102. In addition, a Co-plating barrier layer 106 is formed on the Ni-plating barrier layer 104. By using the electroless plating method, uniform barrier layers can be formed even for an uneven shape such as the via structure.

Here, formation of the deposition layer 102 is a required step when the Ni-plating barrier layer 104 is formed. The deposition layer 102 is formed of Pd, but another material may be used as long as the material is metal exhibiting catalytic activity. Note that in the present embodiment, manufacturing can be performed by the method illustrated in FIG. 10 to FIG. 16.

Fourth Embodiment

Figure 19:
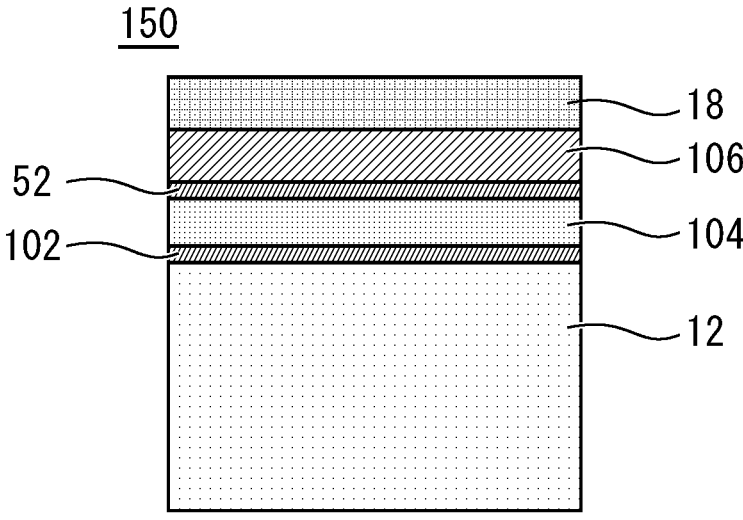
FIG. 19 is a cross-sectional view of a semiconductor device according to a fourth embodiment of the present disclosure.

FIG. 19 is a cross-sectional view of a semiconductor device according to a fourth embodiment of the present disclosure. In a semiconductor device 150, the diffusion prevention layer 52 including Pd is formed in addition to a configuration of the semiconductor 100. In order to prevent mutual diffusion between Ni and Co, the diffusion prevention layer 52 is formed between the Ni-plating barrier layer 104 and the Co-plating barrier layer 106. For the diffusion prevention layer 52, another material than Pd may be used as long as mutual diffusion can be prevented. For example, metal may be used which exhibits catalytic activity for electroless plating deposition, such as Au, Ag, Pt, Sn, or Ru.

Fifth Embodiment

Figure 20:
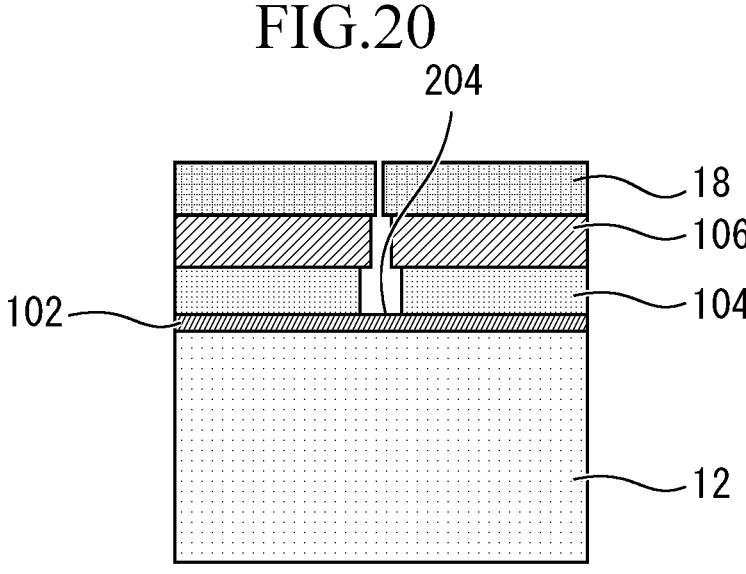
FIG. 20 is a cross-sectional view illustrating a pin hole in a Ni plating film.

Before a description about the present fifth embodiment, a description will be made about a manufacturing process in a case of pin hole formation as an existing problem, as a case for comparison. FIG. 20 is a cross-sectional view illustrating a pin hole in a Ni plating film. When formation failure occurs due to a foreign substance, dirt, or the like, a pin hole 204 might be formed as illustrated in FIG. 20 when the Ni-plating barrier layer 104 is formed. When film formation of the Co-plating barrier layer 106 is continuously performed in this state, because no core for film growth is present, a film cannot be formed in a pin hole portion. As a result, the pin hole remains without being repaired when the metal layer 18 is formed. The present embodiment solves the above-described problem.

Figure 21:
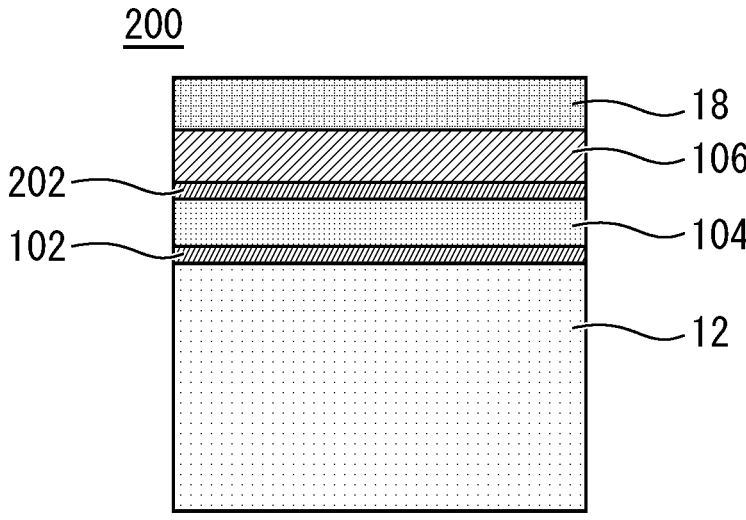
FIG. 21 is a cross-sectional view of a semiconductor device according to a fifth embodiment of the present disclosure.

FIG. 21 is a cross-sectional view of a semiconductor device according to a fifth embodiment of the present disclosure. In a semiconductor device 200, in addition to the configuration of the semiconductor 100, a diffusion prevention layer 202 including Pd is formed by evaporation or a sputtering method. In order to prevent mutual diffusion between Ni and Co, the diffusion prevention layer 202 is formed between the Ni-plating barrier layer 104 and the Co-plating barrier layer 106. For the diffusion prevention layer 202, another material than Pd may be used as long as mutual diffusion can be prevented. For example, metal may be used which exhibits catalytic activity for deposition of electroless plating, such as Au, Ag, Pt, Sn, or Ru.

Figure 22:
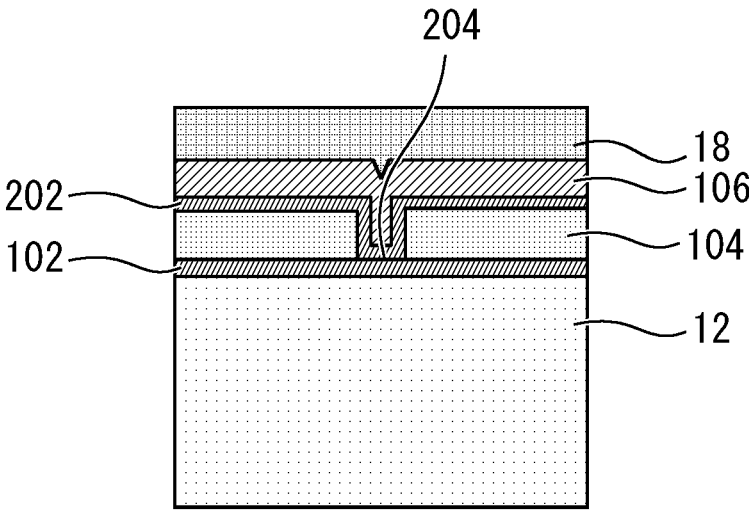
FIG. 22 is a cross-sectional view illustrating a pin hole repairing effect for the Ni plating film according to the fifth embodiment of the present disclosure.

FIG. 22 is a cross-sectional view illustrating a pin hole repairing effect for the Ni plating film according to the fifth embodiment of the present disclosure. Here, the diffusion prevention layer 202 is formed by evaporation or the sputtering method, following the Ni-plating barrier layer 104 in which the pin hole 204 is formed. Because differently from the plating method, evaporation and the sputtering method form a film independently from a base film, the diffusion prevention layer 202 is formed also on the pin hole 204. When following this, film formation of the Co-plating barrier layer 106 is performed, because the core for film growth is present, a film can be formed in the pin hole portion. As a result, the pin hole does not remain in the metal layer 18, and a pin hole which can be formed in the barrier layer is repaired. That is, lowering of the barrier characteristics of the barrier layer can also be prevented.

REFERENCE SIGNS LIST

10, 50, 100, 150, 200 semiconductor device, 12, 40 semiconductor substrate, 18 metal layer, 24, 28, 30 barrier layer, 52, 202 diffusion prevention layer, 102 deposition layer, 104, 106 barrier layer

The invention claimed is:

1. A semiconductor device comprising:
   a semiconductor substrate which is formed of GaAs;
   a first barrier layer which is formed of an alloy containing Ni on the semiconductor substrate;
   a second barrier layer which is formed of Co or an alloy containing Co on the first barrier layer; and
   a metal layer which is formed on the second barrier layer,
     wherein
   a Ni concentration in the first barrier layer is 80 at % or lower.

2. The semiconductor device according to claim 1, comprising
a diffusion prevention layer which contains metal exhibiting catalytic activity
between the first barrier layer and the second barrier layer.

3. The semiconductor device according to claim 2, comprising
a deposition layer in which metal exhibiting catalytic activity is deposited
between the semiconductor substrate and the first barrier layer.

4. The semiconductor device according to claim 1, comprising
a deposition layer in which metal exhibiting catalytic activity is deposited
between the semiconductor substrate and the first barrier layer.

5. A method of manufacturing a semiconductor device, the method comprising:
a step of forming a deposition layer, in which metal exhibiting catalytic activity is deposited, on a semiconductor substrate formed of GaAs;

a step of forming a first barrier layer, which is formed of an alloy containing Ni, on the deposition layer by a plating method;
a step of forming a second barrier layer, which is formed of Co or an alloy containing Co, on the first barrier layer by the plating method;
a step of forming a metal layer on the second barrier layer; and
a step of conducting a heat treatment until a Ni concentration in the first barrier layer becomes 80 at % or lower.

6. The method of manufacturing a semiconductor device according to claim 4, the method comprising
a step of forming a diffusion prevention layer, which contains metal exhibiting catalytic activity,
between the first barrier layer and the second barrier layer.

7. The method of manufacturing a semiconductor device according to claim 6, wherein
the diffusion prevention layer is formed by an evaporation method or a sputtering method.

* * * * *